United States Patent
Brosnihan et al.

[11] Patent Number: 6,121,552
[45] Date of Patent: *Sep. 19, 2000

[54] MICROFABRICATED HIGH ASPECT RATIO DEVICE WITH AN ELECTRICAL ISOLATION TRENCH

[75] Inventors: Timothy J. Brosnihan, Berkeley; James Bustillo, Castro Valley; William A. Clark, Fremont, all of Calif.

[73] Assignee: The Regents of the University of Caliofornia

[*] Notice: This patent issued on a continued prosecution application filed under 37 CFR 1.53(d), and is subject to the twenty year patent term provisions of 35 U.S.C. 154(a)(2).

[21] Appl. No.: 08/874,568

[22] Filed: Jun. 13, 1997

[51] Int. Cl.⁷ ........................................ H05K 1/00
[52] U.S. Cl. ........................................ 174/253
[58] Field of Search ................... 174/253, 255, 174/250; 438/421, 424

[56] References Cited

U.S. PATENT DOCUMENTS

| | | | |
|---|---|---|---|
| 3,725,671 | 4/1973 | Keister et al. | 307/202 |
| 3,936,329 | 2/1976 | Kendall et al. | 148/187 |
| 3,962,052 | 6/1976 | Abbas et al. | 204/129.3 |
| 4,049,903 | 9/1977 | Kobler | 174/68.5 |
| 4,063,271 | 12/1977 | Bean et al. | 357/49 |
| 4,307,507 | 12/1981 | Grey et al. | 29/580 |
| 4,369,565 | 1/1983 | Muramatsu | 29/580 |
| 4,698,900 | 10/1987 | Esquivel | 437/52 |
| 4,764,644 | 8/1988 | Reisman et al. | 174/68.5 |
| 4,874,484 | 10/1989 | Foell et al. | 204/129.3 |
| 5,084,408 | 1/1992 | Baba et al. . | |
| 5,126,810 | 6/1992 | Gotou | 357/23.6 |
| 5,131,978 | 7/1992 | O'Neill | 156/653 |
| 5,198,390 | 3/1993 | MacDonald et al. . | |
| 5,262,021 | 11/1993 | Lehmann et al. | 204/129.55 |
| 5,271,801 | 12/1993 | Valette | 156/643 |
| 5,326,726 | 7/1994 | Tsang et al. . | |
| 5,343,064 | 8/1994 | Spangler et al. . | |
| 5,445,988 | 8/1995 | Schwalke . | |
| 5,447,067 | 9/1995 | Biebl et al. . | |
| 5,504,026 | 4/1996 | Kung . | |
| 5,506,175 | 4/1996 | Zhang et al. . | |
| 5,576,250 | 11/1996 | Diem et al. . | |
| 5,592,015 | 1/1997 | Iida et al. . | |
| 5,719,073 | 2/1998 | Shaw et al. . | |
| 5,747,353 | 5/1998 | Bashir et al. | 438/50 |
| 5,747,867 | 5/1998 | Oppermann . | |
| 5,798,283 | 8/1998 | Montague et al. . | |
| 5,807,783 | 9/1998 | Gaul et al. | 438/406 |
| 5,847,280 | 12/1998 | Sherman et al. . | |
| 5,847,454 | 12/1998 | Shaw et al. . | |
| 5,882,532 | 3/1999 | Field et al. . | |

FOREIGN PATENT DOCUMENTS 1-138110   5/1989   Japan .

OTHER PUBLICATIONS

C.H. Hsu et al., "Micromachined Structures Fabricated Using a Wafer–Bonded Sealed Cavity Process," Solid–State Sensor and Actuator Workshop Hilton Head, S.Caroline, Jun. 13–16, 1994, 151–155.

J. Mohan et al., "An Integrated Accelerometer as a Demonstration of a New Technology Using Silicon Fusion Bonding and Deep Reactive Ion Etching," Stanford University, Center for Integrated Systems, 21–22.

(List continued on next page.)

*Primary Examiner*—Kristine Kincaid
*Assistant Examiner*—Kamand Cuneo
*Attorney, Agent, or Firm*—Fish & Richardson P.C.

[57] ABSTRACT

A microfabricated device having a high vertical aspect ratio and electrical isolation between a structure region and a circuit region. The device may be fabricated on a single substrate and may include electrical interconnections between the structure region and the circuit region. The device includes a substrate and an isolation trench surrounding a structure region in the substrate. The isolation trench includes a lining of a dielectric insulative material. A plurality of electromechanical elements are located in the structure region and are laterally anchored to the isolation trench.

19 Claims, 13 Drawing Sheets

OTHER PUBLICATIONS

L. Parameswaran et al., "Sealed–Cavity Microstructure using Wafer Bonding Technology," The 7th International Conference on Solid–State Sensors and Actuators, 274–277.

L. Parmeswaran et al., "A Merged MEMS–CMOS Process using Silicon Wafer Bonding," IEEE 1995, 4 pgs.

K.A. Shaw et al., "Integrating Scream Micromachined Devices with Integrated Circuits," IEEE 1996, 44–49.

K.A. Shaw et al., "Scream I: a single mask, single–crystal silicon, reactive ion etching process for microelectromechanical structures", School of Electrical Engineering and National Nanofabrication Facility, Cornell University, Ithaca, NY 14853 (USA).

W. Lang et al., "Application of porous silicon as a sacrificial layer," 7th International Conference on Solid—State Sensors and Actuators Digest of Tech. Papers. pp. 202–205, Jun. 7–10, 1993.

Gianchandani et al., "Micron–Sized, High Aspect Ratio Bulk Silicon Micromechanical Devices," *Micro Electro Mechanical Systems '92,* 3 pgs., Feb. 4–7, 1992.

C. H. Hsu et al., "Micromachined Structures Fabricated Using A Wafer–Bonded Sealed Cavity Process," Solid–State sensor and Actuator Workshop Hilton Head, S.Caroline, Jun. 13–16, 1994, 151–155.

J. Mohan et al., "An Integrated Acceleometer as a demonstration of a New Technology Using Silicon Fusion Bonding and Deep Reactive Ion Etching, " Stanford University, Center for Integrated Systems, 21–22, 1996.

L. Parameswaren et al., "Sealed–Cavity Microstructure using Wafer Bonding Technology, " The 7th International Conference on Solid–State Sensors and Actuators, 274–277, 1993.

L. Parameswaren et al., "A Merged MEMS–CMOS Process using Silicon Wafer Bonding," IEEE 1995, 4 pgs.

K. A. Shaw et al., "Integrating Scream Micromachined devices with Integrated Circuits, " IEEE 1996, 44–49.

K. A. Shaw et al., "Scream I: A single mask, Single–crystal silicon, reactive ion etching process for microelectromechanical structures", School of Electrical Engineering and National Nanofabrication Facility, Cornell University, Ithaca, NY 14853 (USA), 1994.

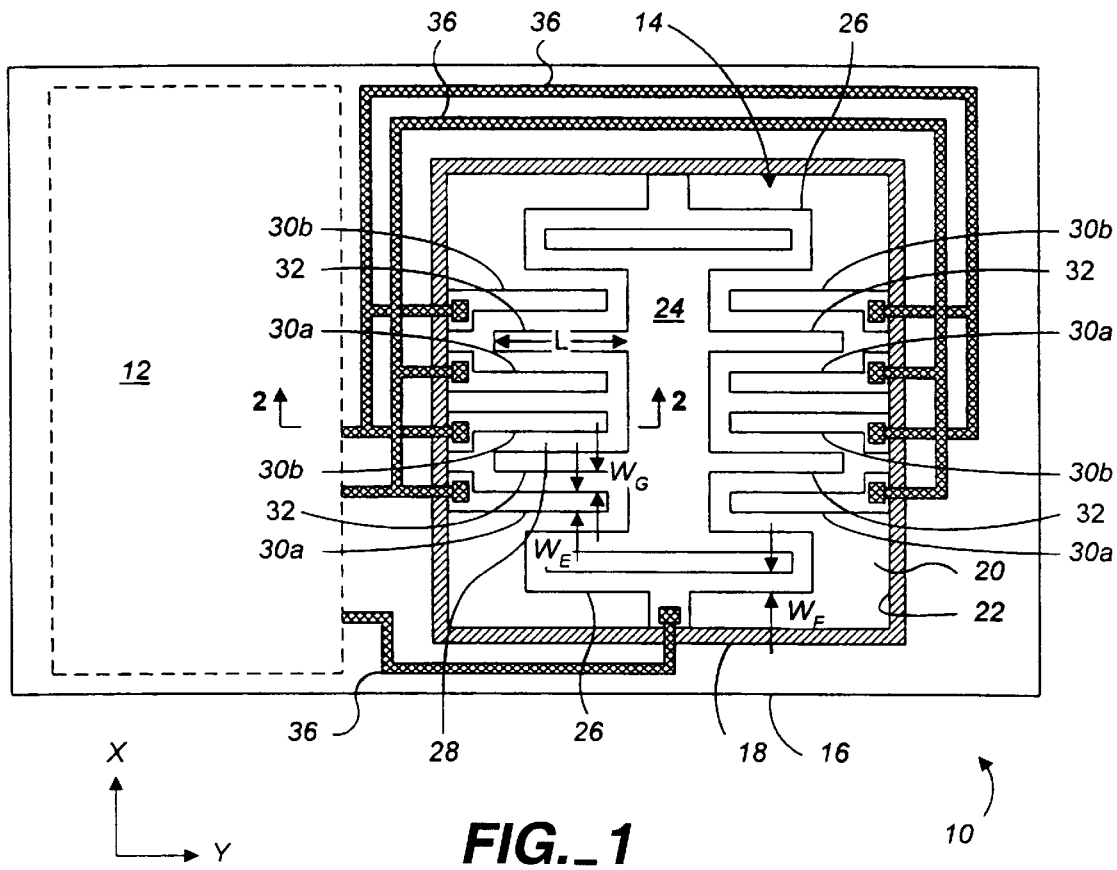
FIG._1
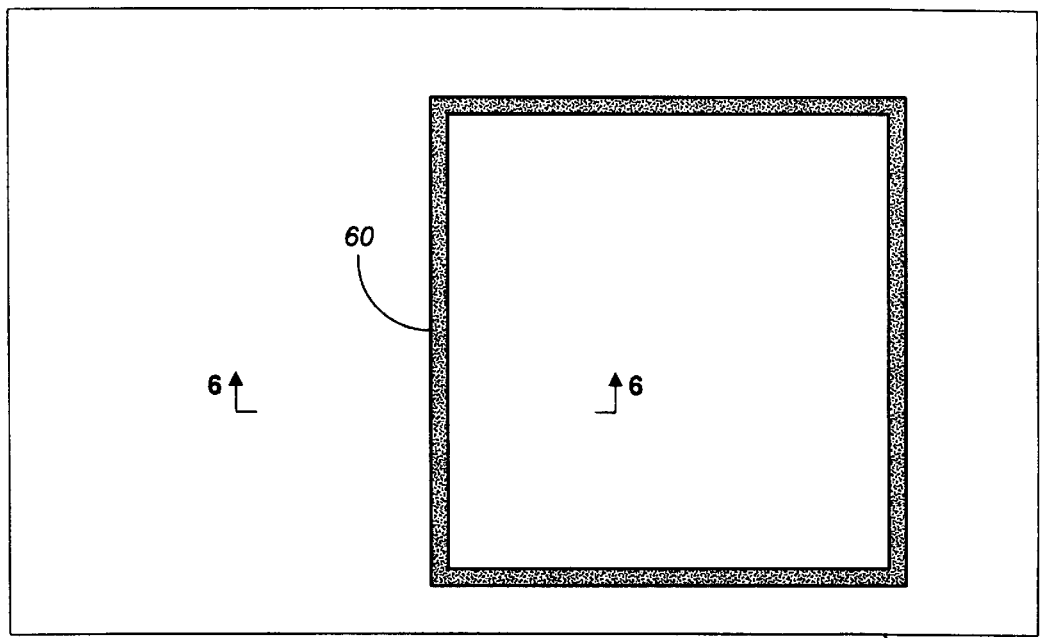
FIG._5

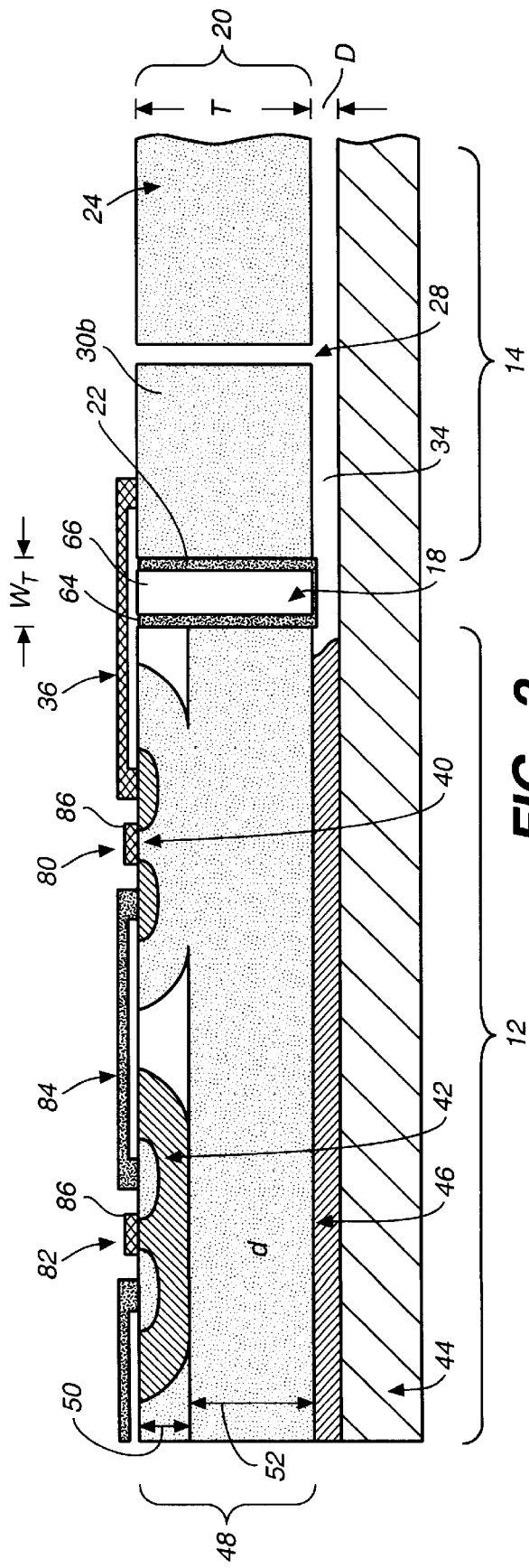
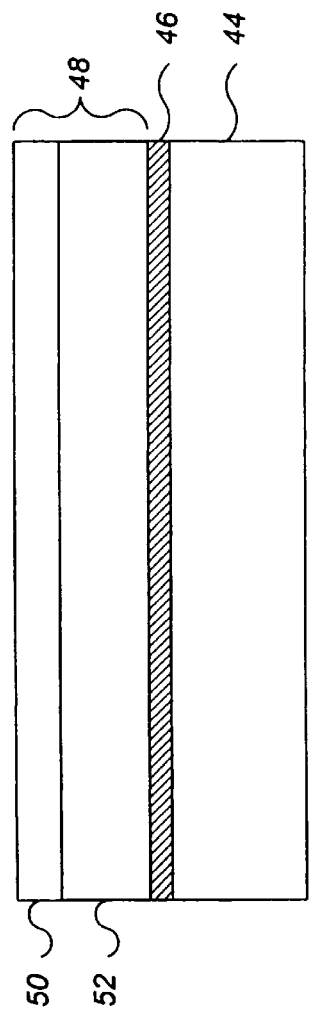
FIG._2
FIG._4

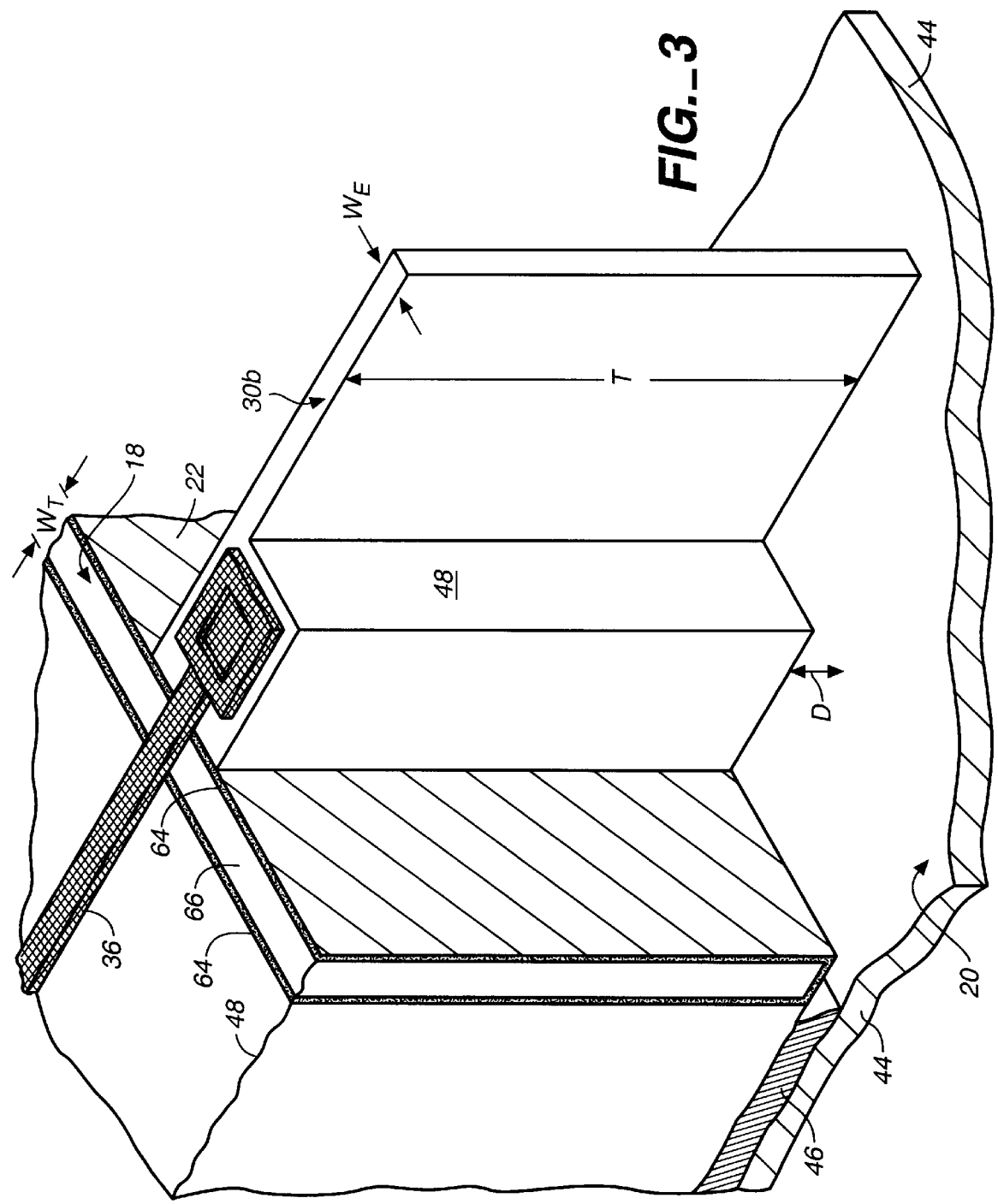
FIG._3

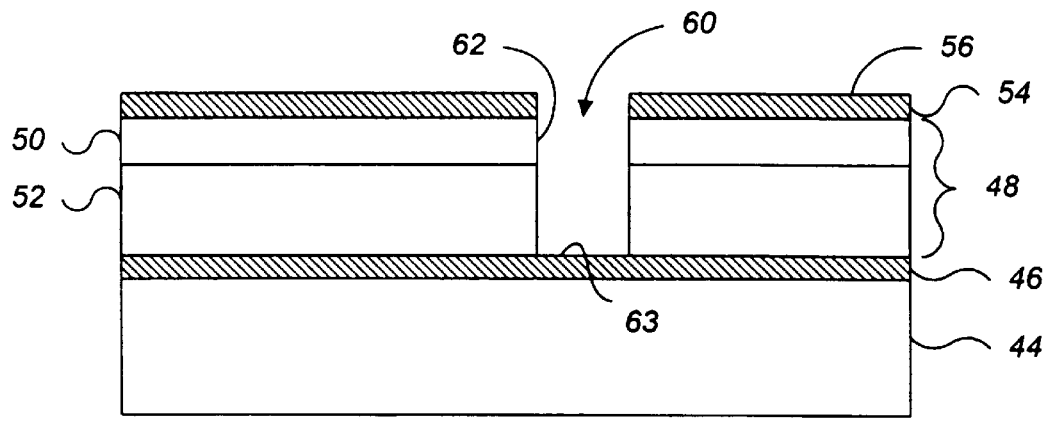
FIG._6
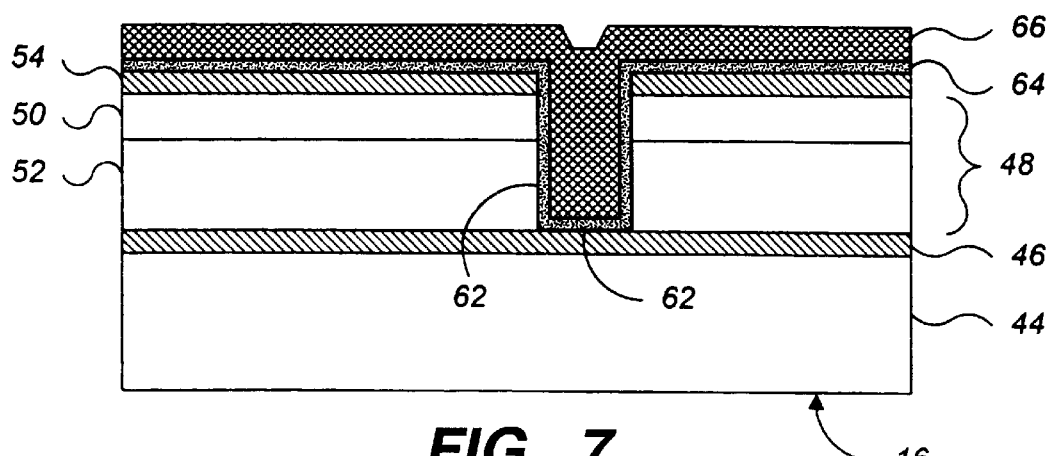
FIG._7
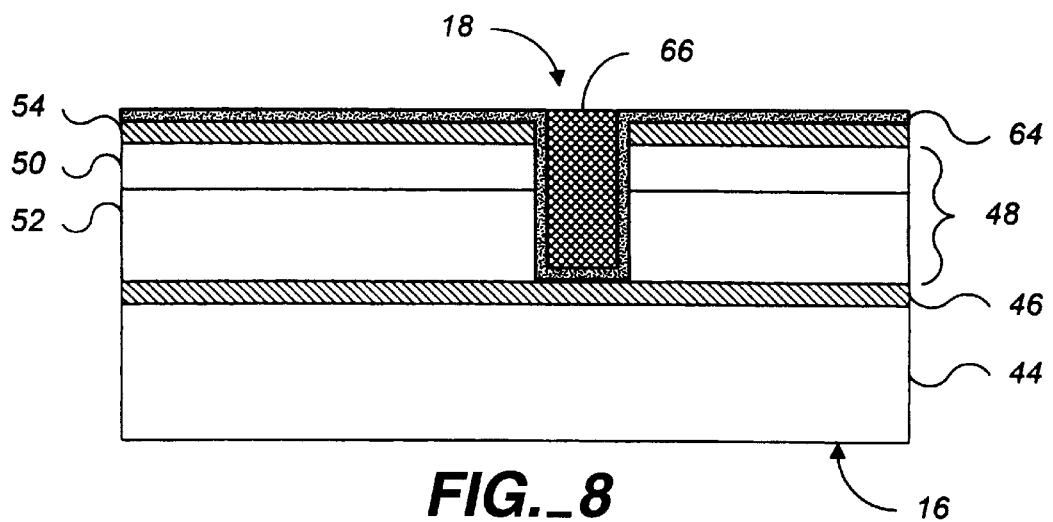
FIG._8

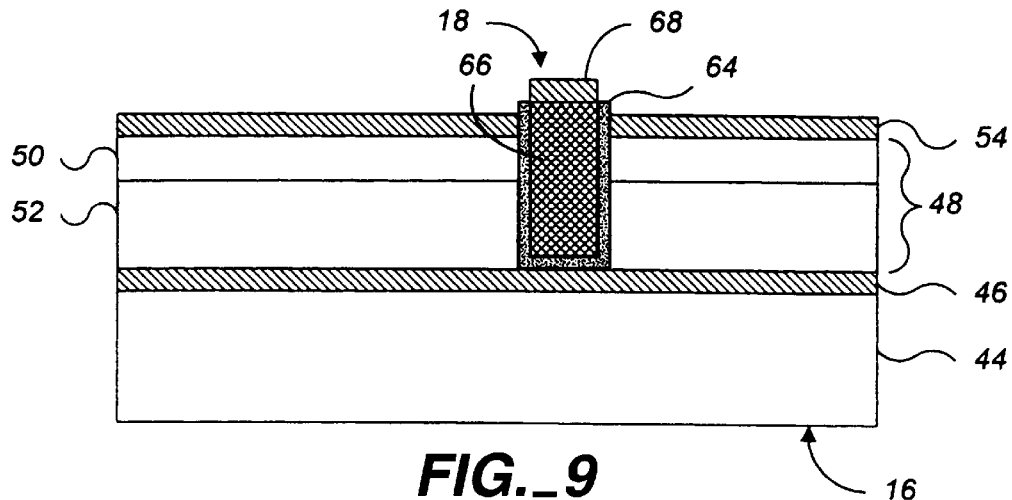
FIG._9
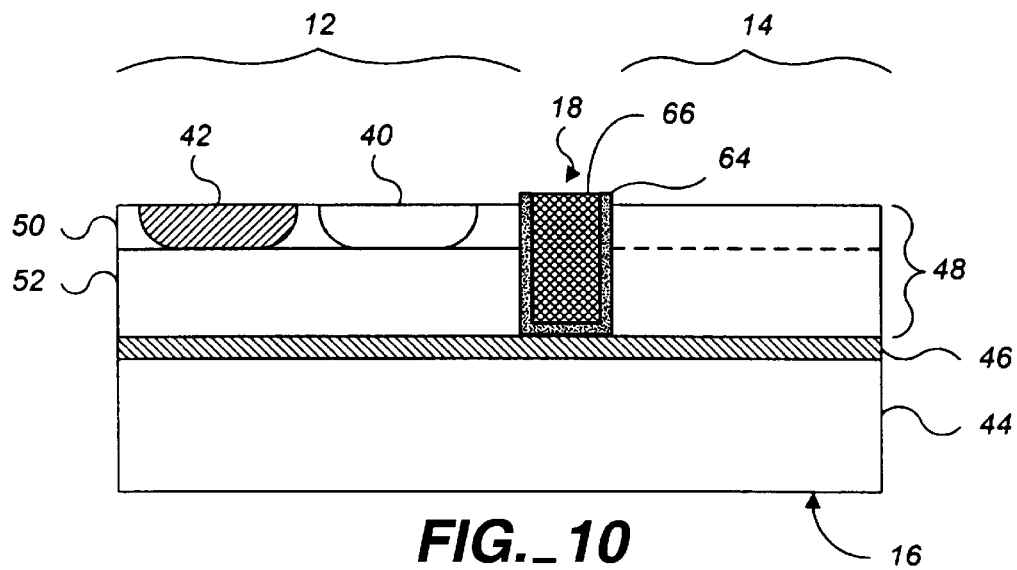
FIG._10
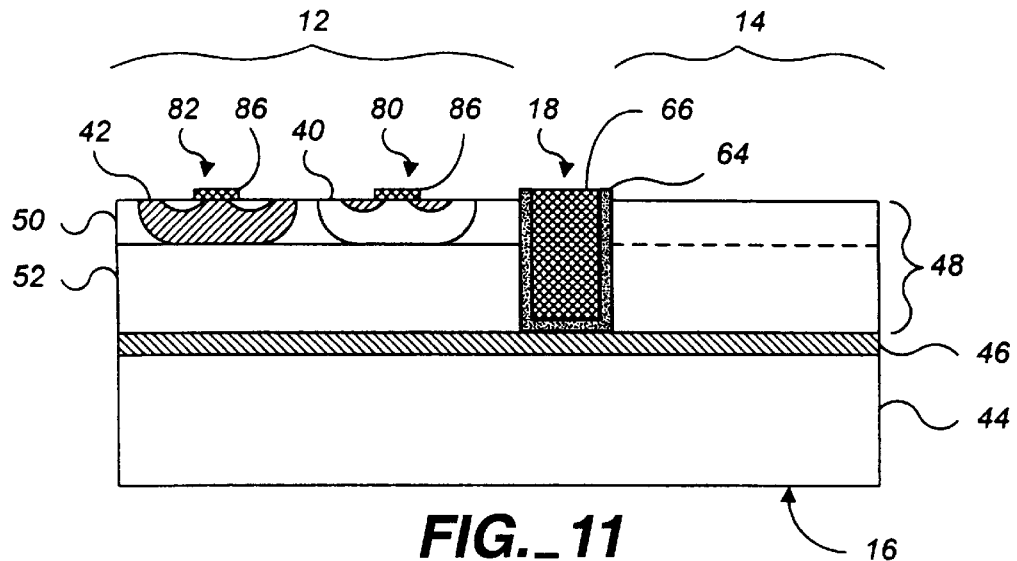
FIG._11

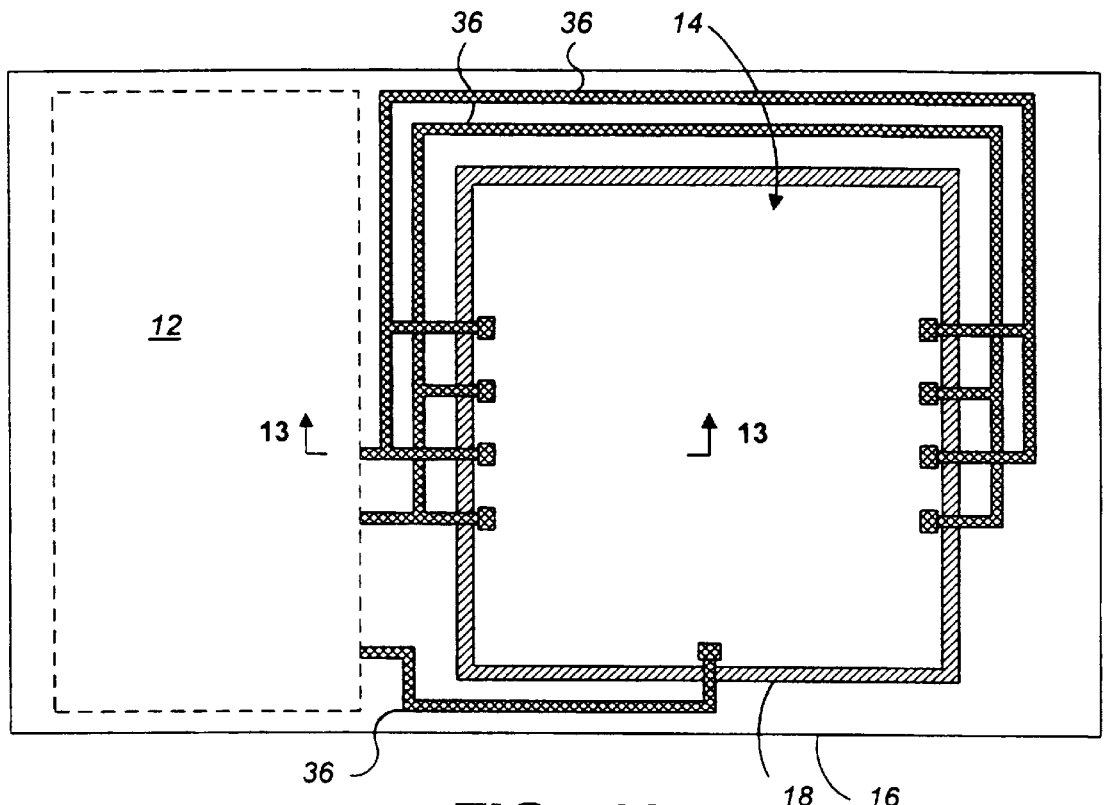
FIG._12
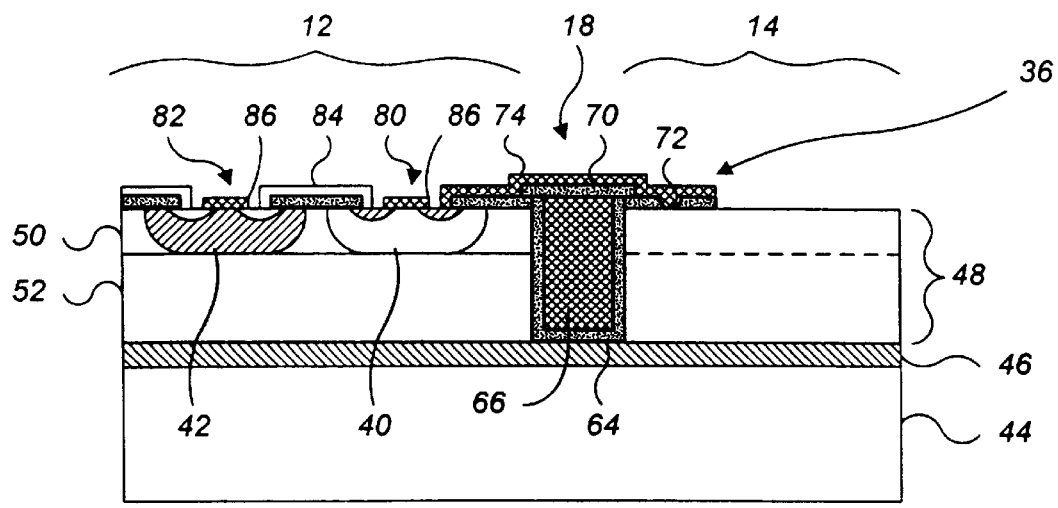
FIG._13

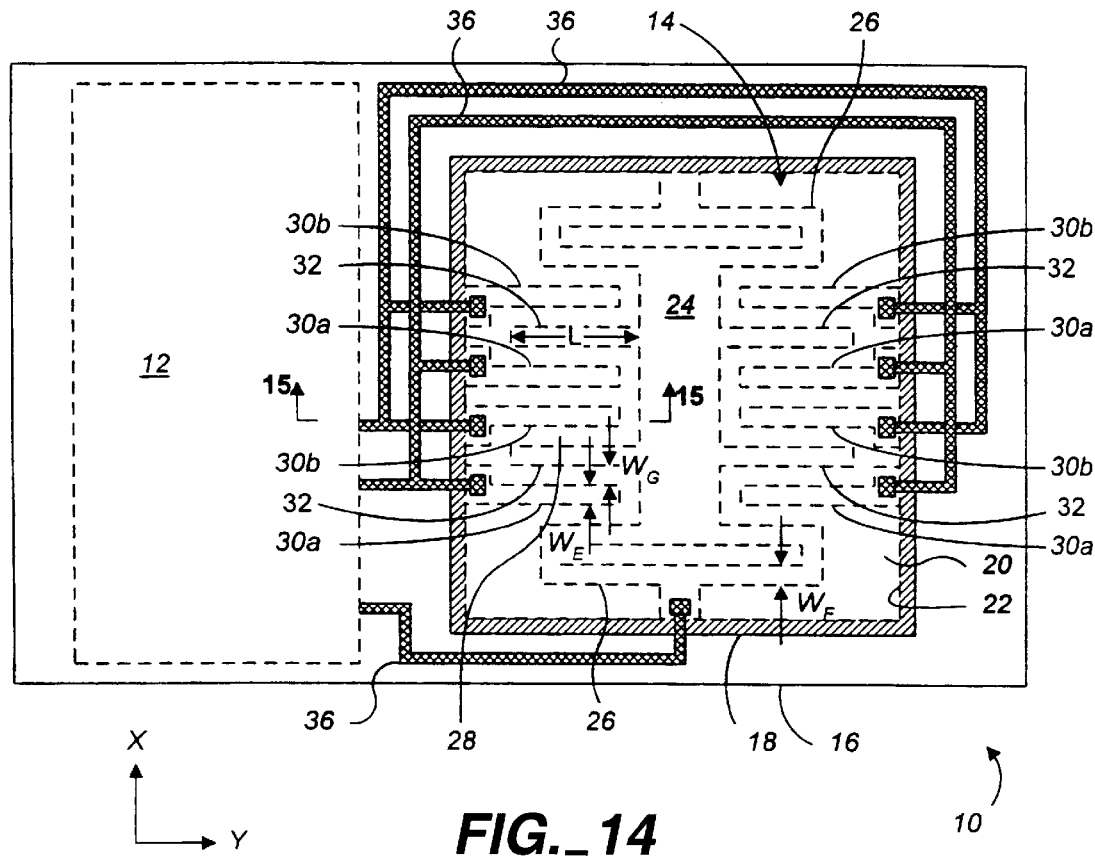
FIG._14
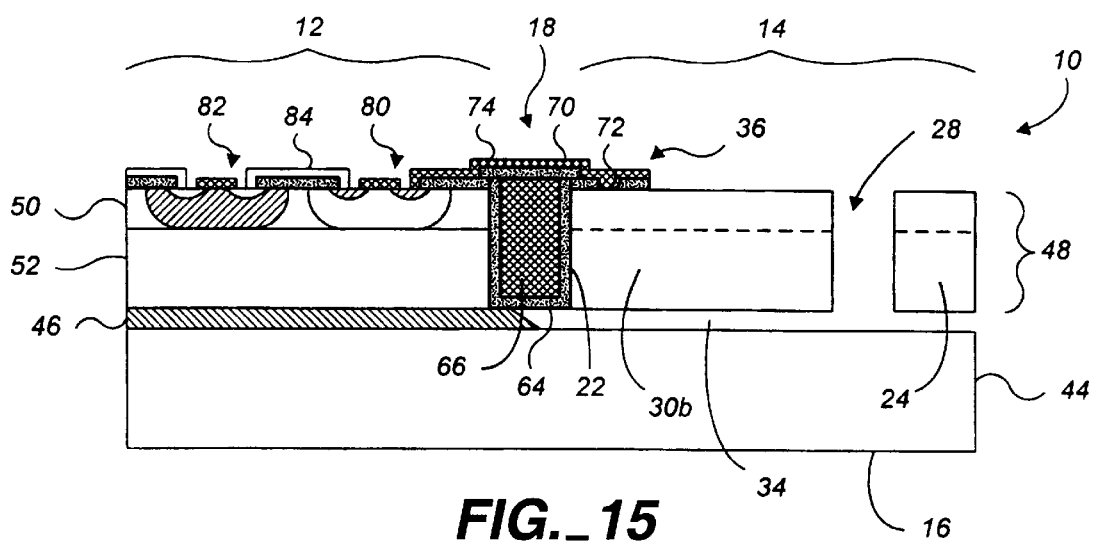
FIG._15

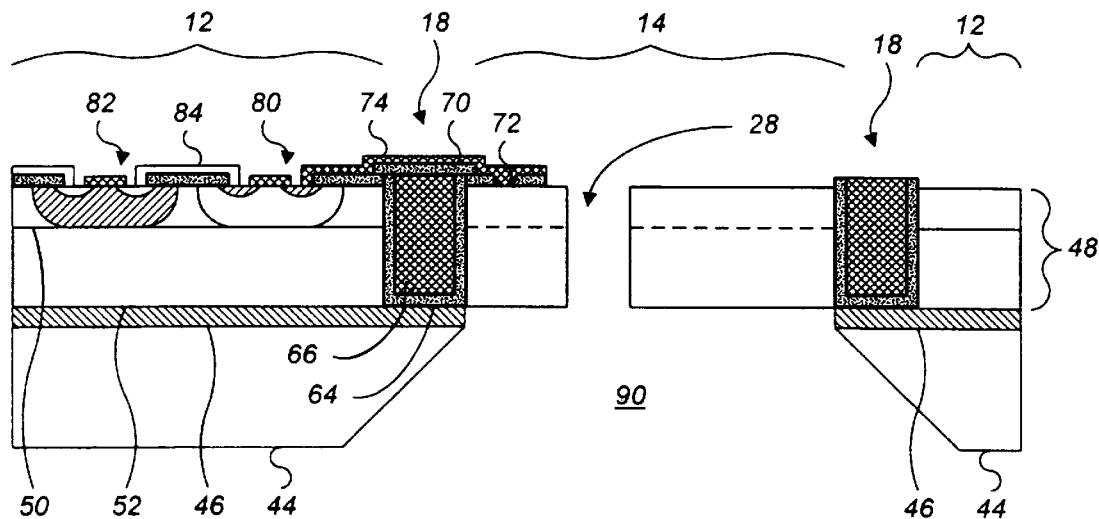
FIG._16A
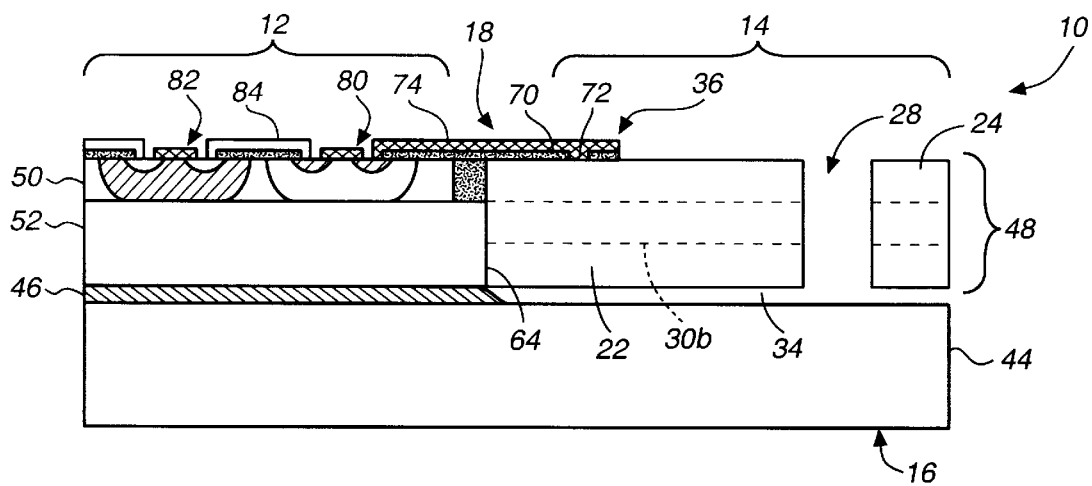
FIG._16B

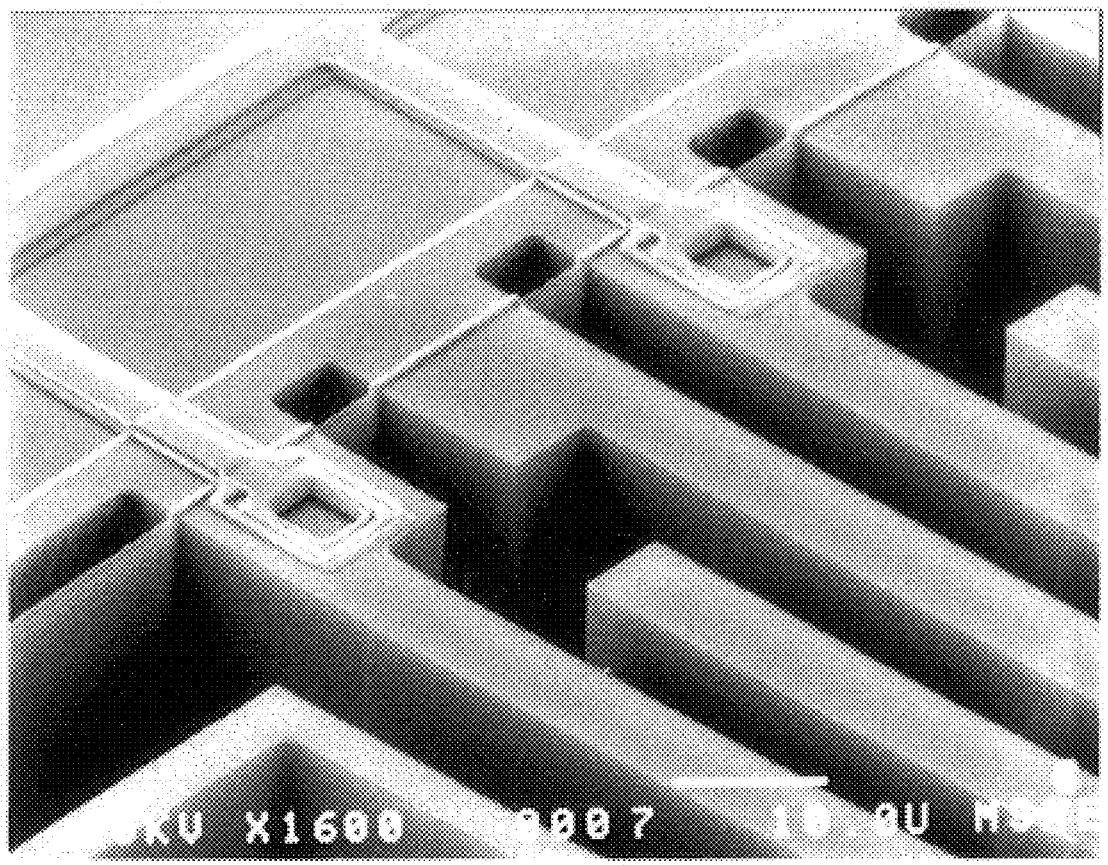
FIG._17

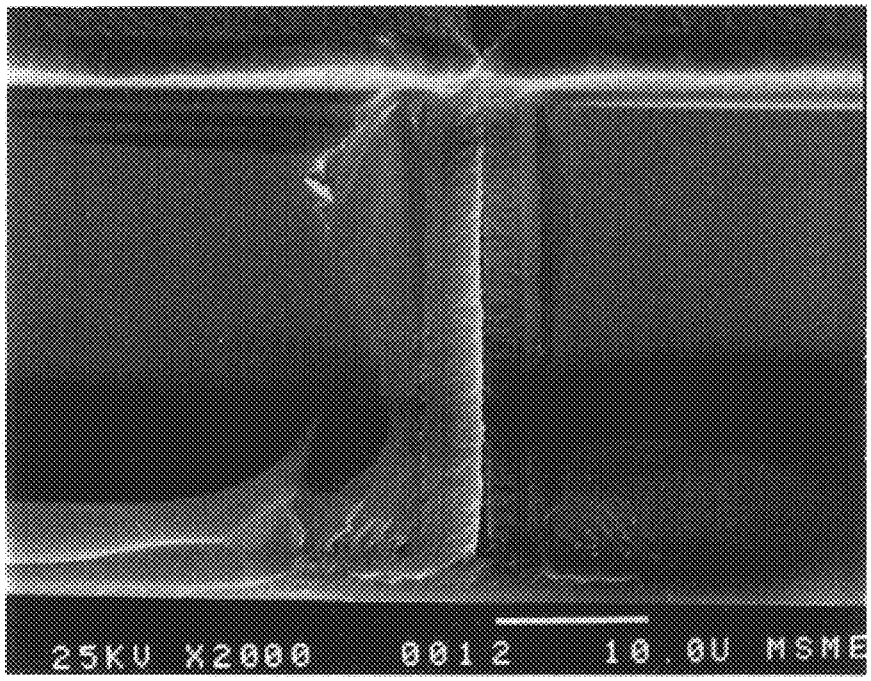
FIG._18
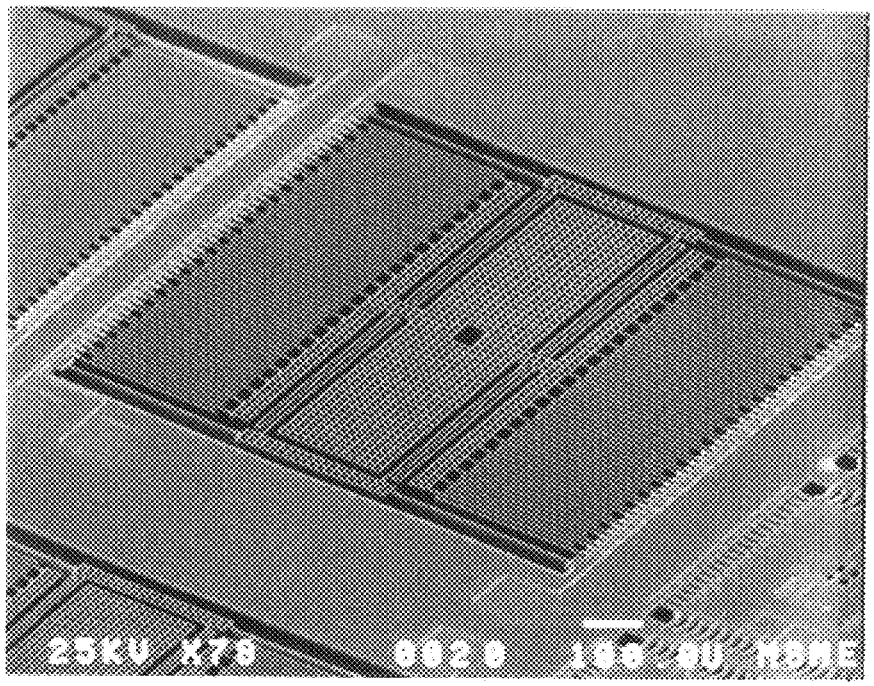
FIG._19

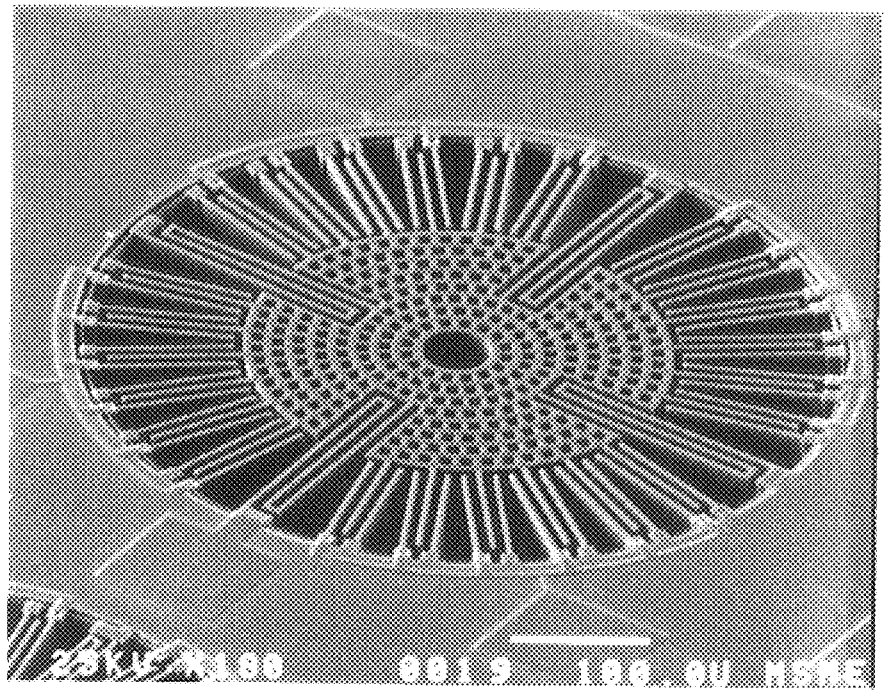
FIG._20
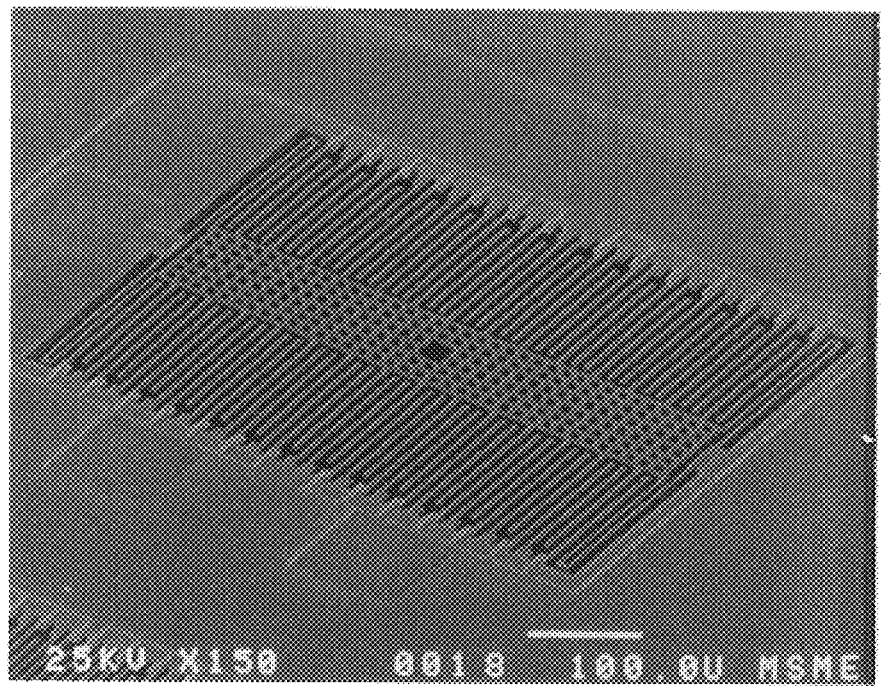
FIG._21

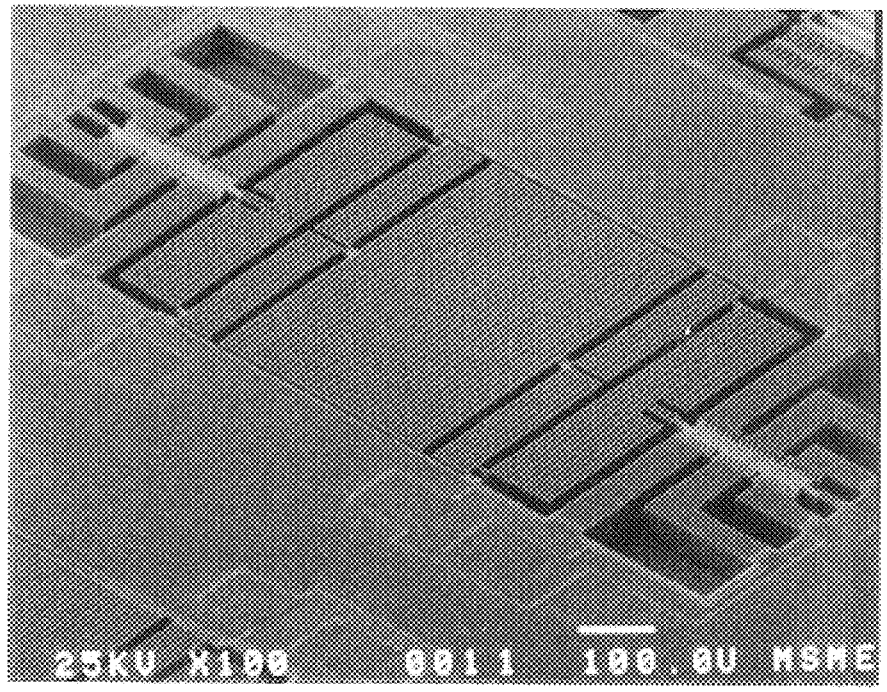
FIG._22
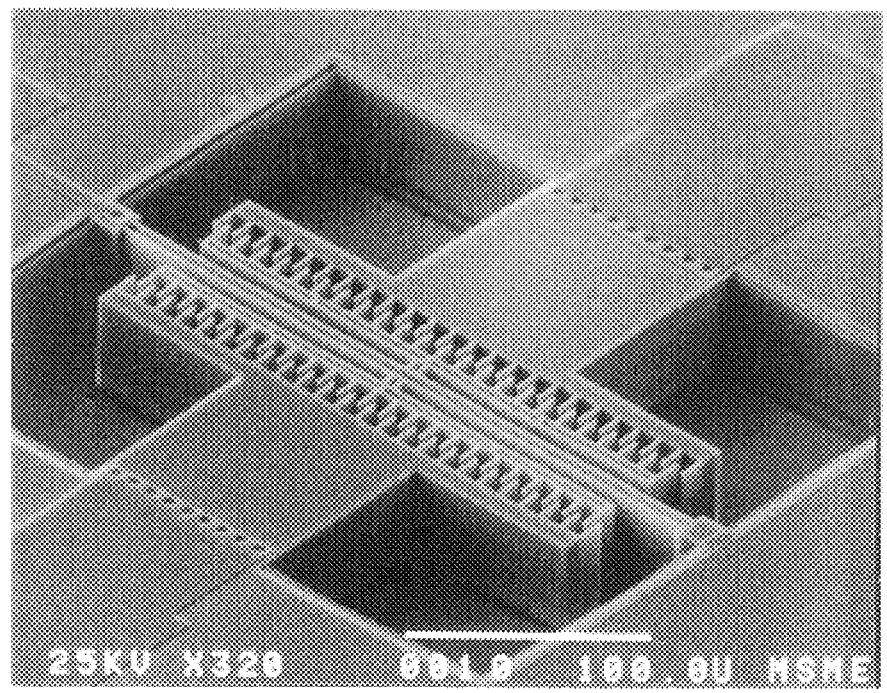
FIG._23

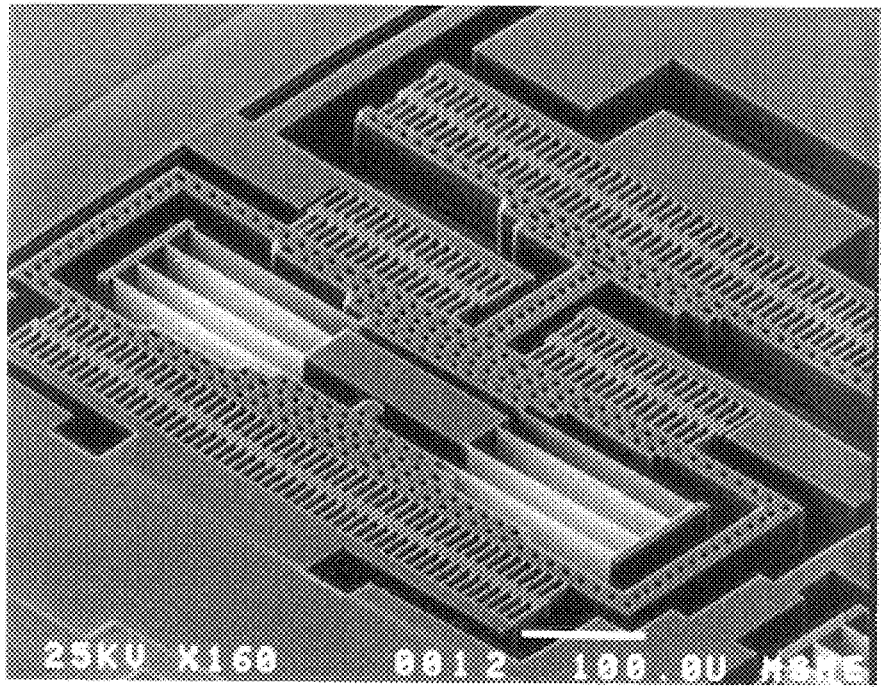
FIG._24
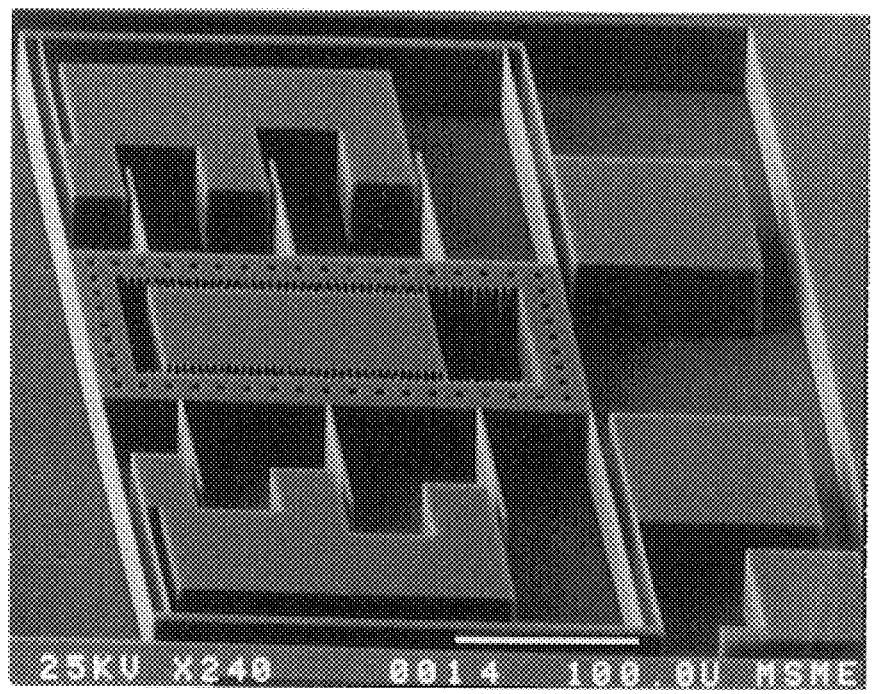
FIG._25

MICROFABRICATED HIGH ASPECT RATIO DEVICE WITH AN ELECTRICAL ISOLATION TRENCH

STATEMENT OF GOVERNMENT RIGHTS

This invention was made with Government support under Grant (Contract) Nos. DABT63-93-C-0065 and DABT63-95C-0028 awarded by DARPA. The Government has certain rights to this invention.

BACKGROUND OF THE INVENTION

The present invention relates generally to microfabricated devices, and more particularly to three dimensional microfabricated devices having a high vertical aspect ratio.

Microelectromechanical systems (MEMS) integrate micromechanical structures and microelectronic circuits on the same silicon chip to create an integrated device. MEMS have many useful applications such as microsensors and microactuators. An example of a microsensor is a gyroscope used in a missile guidance system. An example of a microactuator is a micropositioner used to move a read/write head in a disk drive.

In surface micromachining, the device is fabricated by depositing a thin film on a surface. The thin film is typically deposited by chemical vapor deposition (CVD) and etched to yield a desired shape. Then a layer of sacrificial material underlying the thin film may be etched to open up passageways or clearances between moving parts of the microstructure. The height of the microstructure is limited to the thickness of the deposited thin film. Since the thin film structure has microscopic thickness, on the order of one micron, it tends to be flexible out of the plane of fabrication.

In view of the foregoing, there is a need for a way to make taller microstructures (on the order of 10 to 250 microns). In addition, to increase the overlapping surface area of interdigited electrodes, the microstructures should have a high vertical aspect ratio; that is, such microstructures should have a height significantly larger than their lateral width. Furthermore, to minimize the clearance between interdigited electrodes, the channel between the interdigited electrodes should also have a high vertical aspect ratio.

Several techniques have been developed for making high aspect ratio microstructures, but these techniques have significant fabrication difficulties. One problem in some existing techniques is that the structural elements need to be wire bonded to the electronics. Because differential capacitance-based sensors may require the interconnection of many alternating positive and negative electrode plates (e.g., one hundred plates in an angular accelerometer), the large number of wire bonds makes this fabrication technique impractical.

Another problem in some existing techniques is difficulty in electrically isolating the microstructure elements from each other and from the microelectronic circuits on the chip. Unless the electrode plates are electrically isolated, the two sides of each sensing capacitor will be shorted together through the substrate. Consequently, capacitive sensing schemes cannot be implemented easily using existing techniques.

Accordingly, it would be useful to provide a microfabricated device in which the micromechanical structures have a high vertical aspect ratio and are electrically isolated from each other and from the microelectronic circuits on the chip.

SUMMARY OF THE INVENTION

In one aspect, the invention is directed to a method of fabricating a microelectromechanical system. The method includes providing a substrate having a device layer, etching a first trench in the device layer, depositing a dielectric isolation layer in the first trench, and etching a second trench in the device layer. The first trench surrounds a first region of the substrate, and the second trench is located in the first region and defines a microstructure.

Implementations of the invention include the following. Circuitry may be formed in a second region of the substrate outside the first region, and an electrical connection may be formed over the first trench to connect the microstructure to the circuitry. The isolation layer may fill the first trench, or a filler material may be deposited over the isolation layer in the first trench. The substrate may include a handle layer, a sacrificial layer and the device layer. A portion of the sacrificial layer may be removed to release the microstructure. The sacrificial layer may include silicon dioxide, the device layer may includes epitaxial silicon, and the isolation layer may include silicon nitride.

In another aspect, the invention is directed to a microfabricated device. The device includes a substrate having a device layer and an isolation trench extending through the device layer and surrounding a first region of the substrate. The isolation trench includes a lining of a dielectric insulative material. A plurality of microstructure elements formed from the device layer are located in the first region and are laterally anchored to the isolation trench.

Implementations of the invention include the following. The lining may fill the isolation trench, or a filler material may be deposited on the lining and fill the trench. Circuitry may be formed in a second region of the substrate outside the first region, and an electrical connection may be disposed over the isolation trench to connect at least one of the microstructure elements to the circuitry. The substrate may include a handle layer, a sacrificial layer and the device layer. A portion of the sacrificial layer may be removed from the first region to form a gap between the microstructure elements and the handle layer. The sacrificial layer may include silicon dioxide, the device layer may include epitaxial silicon, and the lining may include silicon nitride.

Advantages of the invention include the following. The microstructures are electrically isolated from the microelectronic circuits, but can be electrically connected to the microelectronic circuits by interconnect layers. The device may be fabricated utilizing standard microfabrication techniques. The invention is compatible with existing very large scale integrated (VLSI) circuit fabrication processes so that microelectronic circuits may be fabricated on the surface of the device. The microstructures have a high vertical aspect ratio (on the order of 10:1 to 25:1 or even higher). Microsensors fabricated according the invention have a larger sense capacitance, and thus an increased signal-to-noise ratio, due to the increased surface area between the electrode fingers. The microstructures also have a larger mass and a larger moment of inertia, and consequently thermal noise is reduced. In addition, the high vertical aspect ratio microstructures have a large separation of vibrational modes.

Other advantages and features of the invention will become apparent from the following description, including the claims and drawings.

BRIEF DESCRIPTION OF THE DRAWINGS

FIG. 1 is a schematic top plan view of a microfabricated device in accordance to the present invention.

FIG. 2 is a cross-sectional view of the device of FIG. 1 along lines 2—2.

FIG. 3 is an enlarged and perspective view of the microfabricated device of FIG. 1.

FIGS. 4, 6–11, 13 and 15 are schematic cross-sectional views.

FIGS. 5, 12 and 14 are schematic plan views illustrating steps in the fabrication of the microfabricated device of FIG. 1. In addition, FIGS. 6, 13 and 15 are cross-sectional views of FIGS. 5, 12 and 14, respectively, along lines 6—6, 13—13 and 15—15, respectively. The scale in the plan views is not the same as the scale in the cross-sectional views.

FIG. 16A is a schematic cross-sectional view illustrating a dry release step for the fabrication process of the present invention.

FIG. 16B is a schematic cross-sectional view illustrating an isolation trench which is entirely filled by the isolation layer.

FIG. 17 is a scanning electron microscope photograph of a microfabricated device fabricated in accordance with the present invention.

FIG. 18 is a scanning electron microscope photograph of a cross-section of an isolation trench.

FIGS. 19–25 are scanning electron microscope photographs of devices fabricated in accordance with the present invention.

DESCRIPTION OF THE PREFERRED EMBODIMENTS

FIGS. 1, 2 and 3 illustrate a microfabricated device 10 in accordance with the present invention. The illustrated microfabricated device is a linear accelerometer. However, the principles of the invention are applicable to many other devices, such as vibromotors, angular accelerometers, gyroscopes, resonators, microactuators, microvalves, filters, and chemical detectors.

Device 10 includes a circuit region 12 and a structure region 14 formed in a substrate 16. As will be described in more detail below, microstructure elements in structure region 14 are electrically isolated from each other and from circuit region 12 by a filled isolation trench region 18.

A recess 20 is etched into an upper surface of substrate 16 in structure region. Recess 20 contains the various microstructure elements, such as electrodes fingers and plates, flexures, and proof mass beams or bodies, required by device 10. The microstructure elements in recess 20 are defined and separated by a channel 28. At least some of the microstructure elements are separated from a handle layer 44 and can move. In addition, because all of the microstructure elements are fabricated from a single device layer 48, the elements are coplanar.

Device 10 includes a proof mass 24 which is laterally anchored to sidewalls 22 of recess 20 by flexures 26. Flexures 26 are designed to suspend proof mass 24 in recess 20 and to permit proof mass 24 to vibrate along the X-axis parallel to the surface of substrate 16. A plurality of stationary electrode fingers 30a and 30b are anchored to and project inwardly along the Y-axis from sidewalls 23 of recess 20. A plurality of movable electrode fingers 32 project from proof mass 24 along the Y-axis and are interdigitated with stationary electrode fingers 30a and 30b. Each movable electrode finger 32 is adjacent to one stationary electrode finger 30a and one stationary electrode finger 30b. The movable microstructure elements in structure region 14, including proof mass 24, electrode fingers 32 and flexures 26, are separated from the bottom of recess 20 by an air gap 34. The air gap 34 may have a width D which is defined by the thickness of a sacrificial layer 46 between device layer 48 and handle layer 44.

Flexures 26 may have a width $W_F$ of about two to six microns. Electrode fingers 30a, 30b and 32 may have a length L of about ten to five-hundred microns and a width $W_E$ of about two to six microns. Stationary electrode fingers 30a and 30b may be separated from movable electrode fingers 32 by a gap having a width $W_g$ of about one to three microns.

The microstructure elements in structure region 14 have a thickness T (see FIG. 2). The thickness T may be about ten microns to one-hundred microns, with the preferred thickness being determined by the application and desired sensitivity. Even thicker microstructures may be possible as anisotropic etching technology improves. The thickness T is much larger than the width $W_F$ of flexures 26, the width $W_F$ of electrode fingers 30a, 30b and 32, or the width $W_g$ of the gap between the stationary and moveable electrode fingers.

Flexures 26 may have a vertical aspect ratio (a ratio of T to $W_F$) of at least about 10:1. Similarly, electrode fingers 30a, 30b and 32 may have a vertical aspect ratio (the ratio of T to WE) of at least 5:1. The gap between stationary electrode fingers 30a and 30b and movable electrode fingers 32 may have a vertical aspect ratio (the ratio of T to $W_G$) of at least 10:1. Vertical aspect ratios of 25:1 may be achieved utilizing current etching techniques.

The high vertical aspect ratio provides an increased surface area between the electrode fingers, and thus a larger sense capacitance. The increased sense capacitance provides an increased signal-to-noise ratio. In addition, the microstructures also have a larger mass and a larger moment of inertia, and consequently reduced thermal noise. Furthermore, the thicker structures are more rigid in the vertical direction and thus less likely to move out of the plane of fabrication. In addition, the high vertical aspect ratio microstructures have a large separation of vibrational modes due to the significant difference in rigidity of the microstructures in different directions.

Circuit region 12 contains the necessary integrated circuitry to drive and/or sense the position of proof mass 24. Circuit region 12 is not shown in detail because its circuitry will depend upon the purpose of the device; that is, the circuitry will depend upon whether the device is an angular accelerometer, gyroscope, linear accelerometer, microactuator, etc. The microelectronic circuitry may be constructed according to known circuit designs, and thus the content of circuit region 12 is not crucial to the invention. However, it may be noted that circuit region 12 may be fabricated utilizing traditional VLSI processes, such as complementary metal oxide semiconductor (CMOS) processes. As shown in FIG. 2, if circuit region 12 is fabricated using CMOS processes, it may include both n-channel transistors 80 and p-channel transistors 82 (not shown in FIG. 1 for the reasons discussed above).

The microstructure elements in structure region 14 may be electrically connected to circuit region 12 by conductive electrical interconnections 36 which extend over isolation trench 18. The electrical interconnections 36 may be formed of polysilicon or a metal such as aluminum, copper or tungsten.

The isolation trench 18 separates circuit region 12 from structure region 14. Isolation trench 18 preforms three primary functions. First, isolation trench 18 electrically isolates structure region 14 from circuit region 12. In addition, isolation trench 18 electrically isolates the microstructure elements in structure region 14 from each other. For example, because they project from different portions of the isolation trench, stationary electrodes 30a are electrically isolated from stationary electrodes 30b and from proof mass 24. Second, isolation trench 18 provides a lateral anchoring point for mechanically anchoring the microstructure elements in structure region 14 to substrate 16. Third, isolation trench 18 provides a bridge to support electrical interconnections 36 between the microstructure elements and the circuit region.

Isolation trench 18 extends entirely through the thickness of device layer 48. Isolation trench 18 may have a width $W_T$ of about two to seven microns. Isolation trench 18 is lined with an isolation layer 64. The isolation layer is an insulating dielectric, such as 0.5 microns of silicon nitride. Isolation trench 18 may be back-filled with a filler material such as undoped polysilicon. Alternately, isolation trench 18 may be entirely filled by isolation layer 64, without use of a filler material. Isolation layer 64 may provide the sidewalls 22 of recess 20.

Fabrication of device 10 comprises three basic steps: formation of isolation trench 18, formation of circuit region 12 and electrical interconnections 36 by VLSI processing, and formation of structure region 14.

Referring to FIG. 4, the fabrication process begins with the formation of isolation trench 18 in substrate 16. Substrate 16 includes a handle layer 44, a sacrificial layer 46, and a device layer 48. The handle layer 44 may comprise a material which bonds to sacrificial layer 46. Handle layer 44 may be silicon or another high-temperature substrate, such as quartz. Sacrificial layer 46 may be a layer of silicon oxide. Sacrificial layer 46 may have a thickness of between about 0.5 and 2.0 microns, such as 1.0 microns.

Device layer 48 may include a surface sublayer 50 and an underlying sublayer 52. Surface sublayer 50 is a layer of a semiconductor material suitable for VLSI processing. Surface sublayer 50 may be formed of epitaxial silicon. Alternatively, surface sublayer 50 may be composed of another semiconductor material such as gallium arsenide. Surface sublayer 50 may be about five microns thick. The dopant levels in surface sublayer 50 may be selected to match a standard VLSI process. For example, surface sublayer 50 may be lightly doped with an n-type dopant for compatibility with a CMOS fabrication process.

Underlying sublayer 52 may be a semiconductor or other material onto which surface sublayer 50 may be grown by an epitaxial process. For example, underlying sublayer 52 may be a single-crystal silicon <100>-substrate. Underlying sublayer 52 may be doped to independently control the electrical properties of the device, such as the resistivity of the microstructure elements in structure region 14. It is advantageous to use antimony as a dopant in underlying sublayer 52 because it minimizes diffusion of the dopant into surface sublayer 50. Underlying sublayer 52 may be about forty-five micron thick.

The thickness of device layer 48 will determine the total thickness T of the microstructure elements in structure region 14. The thickness of sacrificial layer 46 will determine the distance D between the microstructure elements and handle layer 44.

Referring to FIGS. 5 and 6, an etch stop or pad oxide layer 54 is next deposited on an upper surface of surface sublayer 50. Etch stop layer 54 may be composed of an oxide, such as silicon dioxide, and may be deposited by thermal oxidation. Etch stop layer 54 may have a thickness of about 0.18 microns and may be formed on surface sublayer 50 using a wet thermal oxidation step at about 900° C. for about fifty minutes.

Still referring to FIGS. 5 and 6, etch stop layer 54 is photolithographically defined, and both etch stop layer 54 and device layer 48 are etched to form a trench 60. The trench may have a width $W_T$ of about two to seven microns, and a depth equal to the total thickness of device layer 48 and etch stop layer 54, i.e., about forty-five microns. The etch of etch stop layer 54 may be performed using a deep anisotropic plasma etch. Specifically, the etch of the etch stop layer may be performed using reactive ion etching (RIE) by flowing the gasses carbon tetraflouride ($CF_4$), trifluromethane ($CHF_3$) and helium (He) at 90 sccm, 30 sccm and 120 sccm, respectively. This etch may be performed at a power of 850 watts and a pressure of 2.8 Torr.

The device layer 48 may be patterned etched. This etch may be performed using an inductively coupled plasma (ICP) etch. The so-called "Bosch" process may be used, as this process currently provides state-of-the-art anisotropic silicon etching. ICP etching services may be obtained from the Microelectronics Center of North Carolina (MCNC) in Research Triangle Park, North Carolina, or from the Center for Integrated Systems of Stanford University in Palo Alto, Calif.

Referring to the top view of FIG. 5, trench 60 surrounds the portion of device layer 48 which will become structure region 14. Although shown as a simple rectangle, trench 60 may have a more complicated shape, and multiple trenches may be formed in the substrate.

Next, referring to FIG. 7, an isolation layer 64 is deposited onto substrate 16. Isolation layer 64 covers etch stop layer 54 and lines sidewalls 62 and floor 63 of trench 60 (see FIG. 5). The isolation layer 64 is a conformal insulative dielectric, such as silicon nitride. Alternately, isolation layer 64 may be a thermal oxide. Isolation layer 64 may be about 0.26 microns thick. A silicon nitride layer may be deposited using low-pressure chemical vapor deposition (LPCVD) with the deposition gasses dichlorosilane ($SiH_2Cl_2$) and ammonia ($NH_3$) at flow rates of 100 sccm and 25 sccm, respectively. The deposition may be performed at a pressure of 140 mTorr and a temperature of 835° C.

Still referring to FIG. 7, a filler material 66 may be deposited to backfill trench 60. Filler material 66 is also deposited on isolation layer 64. Filler material 66 may be an insulator, semiconductor or conductor. The filler material 66 may be undoped polysilicon and may be deposited by CVD using silane ($SiH_4$) at a pressure of 375 mTorr at a temperature of 610° C. for about ten hours. The thickness of filler material 66 is a function of the width of trench 60. For example, for an LPCVD process, the thickness of the layer of filler material is at least one-half the width of the trench.

Referring to FIG. 8, a chemical mechanical polishing (CMP) process is then used to remove filler material 66 from the surface of isolation layer 64. The filler material 66 is polished until it si flush with the top surface of isolation layer 64.

Referring to FIG. 9, assuming that isolation layer 64 is composed of silicon nitride, a self-aligned nitride etch is performed next. First, a capping layer 68 is grown on filler material 66. Capping layer 68 may be a thermal oxide which grows on the polysilicon of filler material 66 but not on the nitride of isolation layer 64. Capping layer 68 may be 0.24 microns thick and may be grown by a wet oxidation process at 900° C. for about two hours.

After depositing capping layer 68, the portion of isolation layer 64 above etch stop layer 54 is removed. The portion of isolation layer 64 lining trench 60 is not removed. Again assuming that isolation layer 64 is silicon nitride, a blanket plasma nitrite etch is used to remove isolation layer 64. Underlying etch stop layer 54 and capping layer 68 serve as etch stops. The blanket plasma nitride etch may be performed with sulfur hexaflouride ($SF_6$) and helium (He) at flow rates of 175 sccm and 50 sccm, respectively. The etch may be performed at a pressure of 375 mTorr and a power of 250 watts.

This completes the formation of isolation trench 18. The dielectric material of isolation layer 64 lining the walls of trench 18 electrically isolates structure region 14 from circuit region 12. Substrate 16 may now be subjected to standard VLSI processes to form circuit region 12.

Referring to FIG. 10, capping layer 68 and etch stop layer 54 are removed to expose the epitaxial silicon of surface sublayer 50. The etch may be performed using a plasma etch with the etching gasses $CF_4$, $CHF_3$ and He at flow rates of 30 sccm, 35 sccm and 100 sccm, respectively. The etch may be performed at a power of 700 watts and a pressure of 3.0 Torr.

Assuming that circuit region 12 is to be formed on an epitaxial layer using a CMOS process, surface sublayer 50 is doped in circuit region 12 to form an n-well 40 and a p-well 42. However, when n-well 40 is formed, the portion of surface sublayer 50 in structure region 14 is also subjected to the same n-type doping steps used in the circuit fabrication. This causes surface sublayer 50 in structure region 14 to become more conductive. This ensures that the entire thickness of device layer 48 in structure region 14 is a composed of a conductive material.

Next, referring to FIG. 11, transistors 80 and 82 are formed on substrate 16 using standard VLSI techniques to deposit gate structure 86.

Then, referring to FIGS. 12 and 13, electrical interconnections 36 are formed between the microstructure elements in structure region 14 and circuit region 12. Electrical interconnections 84 are also formed between transistors 80 and 82 in circuit region 12. Electrical interconnections 36 may be formed as part of the same standard VLSI process that deposits electrical interconnections 84. Each electrical interconnection 36 includes a conductive layer 74 and an insulative layer 70 to isolate device layer 48 from conductive layer 74. Insulative layer 70 may be formed of silicon nitride. Such a layer may be 0.3 microns thick and may be deposited by LPCVD with the deposition gasses $SiH_2Cl_2$ and $NH_3$, at flow rates of 100 sccm and 25 sccm, respectively. The deposition may be performed at a pressure of 140 mTorr and a temperature of 835° C. Insulative layer 70 may be patterned to form through-holes 72 where electrical contact between device layer 48 and conductive layer 74 is desired.

Following the deposition and patterning of insulative layer 70, conductive layer 74 is deposited and patterned to form the electrical interconnections between structure region 14 and circuit region 12. The conductive layer 74 extends over isolation trench 18 so that electrical interconnections 36 provide the only connections between structure region 14 and circuit region 12.

Conductive layer 74 may be a 0.54 micron thick layer of doped polysilicon deposited by LPCVD using the deposition gasses $SiH_4$ and phosphene ($PH_3$) at flow rates of 100 sccm and 1 sccm, respectively. The deposition may be performed at a temperature of 375 mTorr and a temperature of 610° C. for about five hours. Alternately, conductive layer 74 may be composed of a metal such as aluminum, copper or tungsten.

Having formed the integrated circuitry in circuit region 12, device 10 may be completed by forming the microstructure elements in structure region 14. Referring to FIGS. 14 and 15, a second etching step is used to etch trenches or channels 28 in structure region 14 of device layer 48. FIG. 15 shows the pattern that will be etched into device layer 48 to form channels 28 in phantom. Channels 28 may be etched using an ICP etch similar to the etching step used to form trench 60. The etch stops at the buried sacrificial layer 46.

Finally, sacrificial layer 46 is etched to form air gap 34 and release proof mass 24 and flexures 26 from underlying handle layer 44. The release etch step may remove the sacrificial layer from beneath stationary electrode fingers 30a and 30b and may partially undercut isolation trench 18. The release etch may be performed using a timed hydrofluoric acid (HF) etch. This wet etch may be performed using about 49% concentration HF for about one minute. The wet etch may be followed by critical point carbon dioxide drying.

The lithographic definition of channels 28 may overlap isolation trench 18. This guarantees that all MEMS structures are electrically isolated from one another even in the event of mask misalignment by insuring the removal of all conductive material of device layer 48 from the trench side walls. This may cause the etch of channels 28 to also etch a portion of filler material 66 in isolation trench 18. As shown in FIG. 17, if filler material 66 is etched, this process will create silicon nitride walls which bridge the gaps between the adjacent electrode fingers.

In an alternate embodiment, a dry release process may be used to remove the portion of sacrificial layer 46 beneath structure region 14. Referring to FIG. 16A, the portion of handle layer 44 beneath structure region 14 may be etched to form a cavity 90 and expose sacrificial layer 46. The etching of handle layer 44 may be performed using an anisotropic wet etch with potassium hydroxide (KOH) or EDP. Alternately, handle layer 44 could be isotropically etched. Then, sacrificial layer 46 may be removed using a dry oxide etch through the cavity. In the resulting device, the microstructure elements in structure region 14 are suspended in an open space rather than forming an air gap with handle layer 44. The dry release step permits the isolation layer 64 to be a thermal oxide layer rather than a nitride layer.

Referring to FIG. 16B, in another embodiment, trench 60 is entirely filled by isolation layer 64. This embodiment does not use a filler material 66. Instead, isolation layer 64 grows on the sidewalls of the trench to fill the trench. In this embodiment, trench 60 has a width $W_T$ of only about one to two microns. No CMP step and no capping layer are needed in this embodiment because the isolation layer covers the entire surface of sublayer 50.

In another embodiment, trench 60 could be etched through sacrificial layer 46 to expose handling layer 44. Then isolation layer 64 could be deposited onto sidewalls 62 and handle layer 44 at the bottom of trench 60. This would prevent the wet etch of the release step from undercutting isolation trench 18 because the isolation trench would extend entirely to the bottom surface of handle layer 44.

Referring to FIGS. 17, a device having an isolation trench was fabricated. The trench electrically isolates adjacent stationary electrodes from each other and from the circuit region. A silicon nitride isolation layer lines the edges of the isolation trench, and it is filled with an undoped polysilicon filler material. A portion of the filler material in the isolation trench was also etched, leaving silicon nitride walls bridging the gaps between the adjacent electrode fingers.

Referring to FIG. 18, the dark region at the bottom of the image is the silicon oxide sacrificial layer and the grey region above it is the silicon device layer. The two vertical stripes are the silicon nitride isolation material, and the rough region between the vertical stripes is the polysilicon filler material. The region where the vertical stripes of the isolation layer curve and become horizontal show that the bottom of the isolation trench included a "footing effect". That is, the bottom of the trench, and the isolation layer deposited therein, extends horizontally into the device layer. It is believed that this footing effect is caused by lateral etching when the trench etch front encounters the oxide of the sacrificial layer. The footing provides additional mechanical strength to the anchors. In addition, as shown by the black triangular region near the bottom of the trench, a "keyhole" is present where the polysilicon backfill did not completely close off the bottom of the trench.

FIGS. 19–25 show a variety of test structures that were fabricated to evaluate the present invention. These test structures included isolation trenches and interconnect layers to demonstrate process functionality. They did not include microelectronic circuits. The devices are a Z-axis gyroscope (FIG. 19), an angular accelerometer (FIG. 20), a linear accelerometer (FIG. 21), a resonant accelerometer (FIG. 22), a resonator (FIG. 23), a vibro-motor (FIG. 24), and a stain-failure test device (FIG. 25).

In summary, a microfabrication process has been described for forming a device having a high vertical aspect ratio and electrical isolation between a structure region and a circuit region. The device may be fabricated on a single substrate and may include electrical interconnections between the structure region and the circuit region.

The present invention has been described in terms of a preferred embodiment. The invention however is not limited to the embodiment depicted and described. Rather the scope of the invention is defined by the pending claims.

What is claimed is:

1. A microfabricated device, comprising:
   a substrate having a device layer;
   an isolation trench extending through the device layer and electrically isolating a first region of the substrate from a second region of the substrate, the isolation trench including a lining of a dielectric insulative material; and
   a plurality of electromechanical or mechanical microstructure elements formed from the device layer in the first region and laterally anchored to the isolation trench.

2. The device of claim 1 wherein the isolation trench further includes a filler material deposited on the lining and filling the trench.

3. The device of claim 1 wherein the lining fills the trench.

4. The device of claim 1 further comprising circuitry formed in the second region of the substrate outside the first region.

5. The device of claim 4 further comprising an electrical connection disposed over the isolation trench to connect at least one of the microstructure elements to the circuitry.

6. The device of claim 1 wherein the substrate further includes a handle layer and a sacrificial layer.

7. The device of claim 6 wherein the sacrificial layer includes silicon dioxide.

8. The device of claim 6 wherein at least a portion of the sacrificial layer is removed from the first region to form a gap between the microstructure elements and the handle layer.

9. The device of claim 1 wherein the device layer includes epitaxial silicon.

10. The device of claim 1 wherein the lining includes silicon nitride.

11. The device of claim 6 wherein at least one of the microstructure elements is connected to the handle layer by the sacrificial layer.

12. The device of claim 1, wherein at least one of the microstructure elements is generally immobile.

13. The device of claim 1, wherein at least one of the microstructure elements includes a first generally immobile portion laterally anchored to the isolation trench and a second movable portion in the cavity.

14. The device of claim 1, wherein the cavity extends entirely through the device layer.

15. The device of claim 1, wherein the isolation trench surrounds the first region.

16. A microfabricated device, comprising:
   a substrate having a device layer;
   an isolation trench extending through the device layer and electrically isolating a first region of the substrate from a second region of the substrate, the isolation trench including a lining of a dielectric insulative material; and
   a plurality of electromechanical or mechanical microstructure elements formed from the device layer in the first region and laterally anchored to the isolation trench and separated from each other by gaps.

17. A microfabricated device, comprising:
   a substrate having a device layer;
   an isolation trench extending through the device layer and electrically isolating a first region of the substrate from a second region of the substrate, the isolation trench including a lining of a dielectric insulative material;
   a cavity formed in a surface of the first region of the substrate; and
   a mechanical or electromechanical microstructure element formed from the device layer in the first region, the microstructure element including a first stationary portion laterally anchored to the isolation trench and a second movable portion extending into the cavity.

18. A microfabricated device, comprising:
   a substrate having a device layer;
   an isolation trench extending through the device layer and electrically isolating a first region of the substrate from a second region of the substrate, the isolation trench including a lining of a dielectric insulative material;
   a cavity formed in a surface of the first region of the device layer proximate to the isolation trench; and
   a mechanical or electromechanical microstructure element formed from the device layer in the first region, the microstructure element laterally anchored to the isolation trench and projecting into the cavity.

19. A microfabricated device, comprising:
   a substrate having a device layer with a first region and a second region;
   an isolation trench extending through the device layer along a border between the first region and the second region to electrically isolate the first region from the second region, the isolation trench including a lining of a dielectric insulative material; and
   an electromechanical or mechanical microstructure element formed from the device layer in the first region and laterally anchored to the isolation trench.

* * * * *

UNITED STATES PATENT AND TRADEMARK OFFICE
CERTIFICATE OF CORRECTION

PATENT NO.     : 6,121,552
DATED          : September 19, 2000
INVENTOR(S)    : Timothy J. Brosnihan, James M. Bustillo and William A. Clark It is certified that error appears in the above-identified patent and that said Letters Patent is hereby corrected as shown below:

<u>Title page,</u>
Item [73], Assignee, should read: -- The Regents of the University of California --

Signed and Sealed this

Fifth Day of August, 2003

JAMES E. ROGAN
*Director of the United States Patent and Trademark Office*